(12) United States Patent
Stopa et al.

(10) Patent No.: US 6,318,886 B1
(45) Date of Patent: Nov. 20, 2001

(54) HIGH FLUX LED ASSEMBLY

(75) Inventors: James L. Stopa, Old Saybrook; David J. Sousa, Clinton, both of CT (US)

(73) Assignee: Whelen Engineering Company, Chester, CT (US)

( * ) Notice: Subject to any disclaimer, the term of this patent is extended or adjusted under 35 U.S.C. 154(b) by 0 days.

(21) Appl. No.: 09/502,137

(22) Filed: Feb. 11, 2000

(51) Int. Cl.[7] ....................................................... F21V 7/04
(52) U.S. Cl. ........................... 362/555; 362/243; 362/800
(58) Field of Search ..................................... 362/555, 545, 362/346, 347, 800, 241, 245

(56) References Cited

U.S. PATENT DOCUMENTS 5,119,174 * 6/1992 Chen ........................................ 357/80

* cited by examiner

Primary Examiner—Sandra O'Shea
Assistant Examiner—John Anthony Ward
(74) Attorney, Agent, or Firm—Alix, Yale & Ristas, LLP

(57) ABSTRACT

A high intensity light source employs a plurality of light emitting diodes associated with a unitary reflector subassembly. The reflector subassembly defines an array of frustoconical reflectors arranged in rows and columns with the adjacent reflectors of each row being connected by a diverging slot with reflective wall surfaces. The light emitting diodes are mounted on a printed circuit board which forms a component of heat sink subassembly.

14 Claims, 7 Drawing Sheets

HIGH FLUX LED ASSEMBLY

BACKGROUND OF THE INVENTION

1. Field of The Invention

The present invention relates to the generation of high intensity light and, particularly, to light sources comprised of an array of light emitting diodes and an associated reflector, specifically a reflector assembly which cooperates with an efficient heat sink. This invention is also directed to the exercise of control over the aforementioned light sources so as to achieve high output light flux and long service life. Accordingly, the general objects of the present invention are to provide novel and improved methods and apparatus of such character.

2. Description of The Prior Art

The present invention relates to the use of arrays of light emitting diodes (LED's) to generate light which, when appropriately directed, is of relatively high intensity. When the LED's of such arrays are energized simultaneously and intermittently, the potential for employment of the resulting bursts of light for warning purposes is presented. In the prior art, however, the application of LED's arrays to uses such as, for example, emergency vehicle warning lights has been precluded by the inherent operating characteristics of the LED's themselves.

An LED, being a solid state electronic device, is susceptible to thermal damage. The possibility of damage resulting from overheating is, of course, increased when the devices are closely spaced in an array so as to present, to a viewer, the illusion of a single source of light. The requisite heat sinking, i.e., the transfer of heat away from the LED's of a closely spaced array, has not previously been accomplished in a manner which is economical and, when considered from both the thermal and volumetric view points, efficient.

The use of an array of closely spaced high output LED's to generate a high intensity light beam has also been impeded by the lack of a means for combining the light from all of the devices of the array into a single focused light beam in an optically efficient manner. Restated, the inherent spacial radiation pattern of an LED capable of producing a high luminous flux is such that the production of a beam of light from an array of such LED devices can be achieved only through appropriate focusing. Optics capable of accomplishing such focusing without significant attenuation have not previously been available.

A further impediment to the use of LED arrays to generate focused high intensity light resides in the electro-optic characteristics of the devices themselves. It is known that the magnitude of the light flux generated by an LED is directly proportional to the excitation current. However, it is also known that the service life of an LED is a function of the current which is caused to flow through the device over its life. Thus, a balance must be achieved between the excitation current, and thus the light output, and life expectancy. The achieving of such a balance becomes a particularly difficult task in the case of a vehicular application since the input voltage to the controller for the array will vary with the condition of the vehicle's battery and the rotational speed of the vehicle's alternator. In summary, prior controllers for LED arrays lacked the ability to provide and maintain a level of energization commensurate with a current flow which would achieve a preselected service life at an appropriate level of light flux.

SUMMARY OF THE INVENTION

The present invention overcomes the above briefly discussed and other deficiencies and disadvantages of the prior art and thereby allows the use of LED arrays to produce high intensity light, having a shaped spacial radiation pattern, while simultaneously ensuring a long service life.

The invention encompasses a unique reflector, optimally a single molded part, which defines an array of closely spaced frustoconical reflectors which receive individual LED's. In a preferred embodiment, the individual conical reflectors are arranged in rows and adjacent reflectors in each row are interconnected by means of generally obelisk shaped grooves which diverge in width from their bases to the side of the reflector assembly which faces in the direction in which the emitted light is to be transmitted.

In addition, the invention encompasses a unique technique for heat sinking an array of LEDs to provide a product which is both thermally and volumetrically efficient. The heat sink structure is multilayer and includes a printed circuit board, plated with copper on its opposed sides, with an array of copper plated through-holes which efficiently transfer heat from a first side of the PC board, which is bonded to the LEDs via an adhesive which has a high thermal conductivity, to the second side of the PC board. The layer of copper on the second side of the PC board is thermally coupled to a base, characterized by having a high thermal conductivity, via a low thermal resistance intermediate. This low thermal resistance intermediate may be defined by a thermally conductive encapsulate. The above-discussed reflector may be mounted on the multilayer heat sink structure.

The present invention further encompasses control circuitry which achieves and maintains a preselected average LED energization current, less than the rated peak current of the diodes, commensurate with a desired output light flux. This average energizing current is selected to take into account the characteristic light output versus time curve of the LED. A controller in accordance with the present invention also, in a preferred embodiment, compensates for variations in input, i.e., supply voltage. In one reduction to practice of the invention, the controller comprised a microprocessor operating as a current controlled pulse width modulator. In a preferred second embodiment, the controller was a step-down switching regulator.

In accordance with a third control circuit embodiment, which may be employed as an enhancement to the other embodiments, the controller varied the voltage applied to the LED's as a function of the temperature of the reflector.

BRIEF DESCRIPTION OF THE DRAWINGS

The present invention may be better understood, and its numerous objects and advantages will become apparent to those skilled in the art, by reference to the accompanying drawings wherein like reference numerals refer to like elements in the several figures and in which.

DESCRIPTION OF THE DISCLOSED EMBODIMENTS

Figure 1:
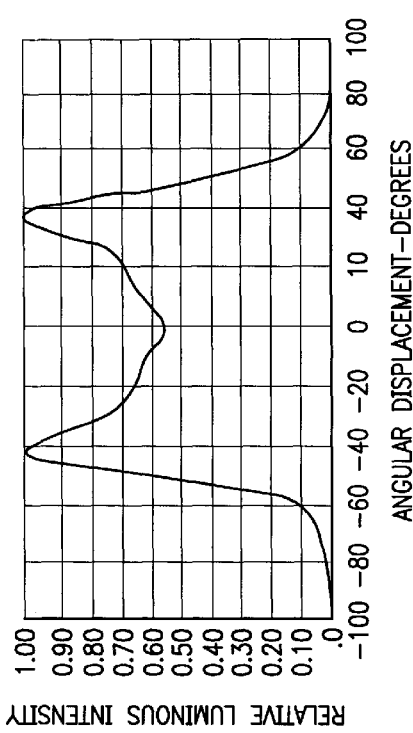
FIG. 1 is a graphical representation of the spacial radiation pattern, in a horizontal plane, of a light emitting diode of a type capable of generating a high light flux.

Commercially available LED's have an integral plastic lens which defines an axis. With reference to the drawings, FIG. 1 represents an "M" shaped plot of relative luminous intensity versus angular displacement for a recently introduced high intensity LED. As may be seen from FIG. 1, the light produced by such LED's is concentrated by the integral lens in a ring located approximately 40° off-axis. This condition could be rectified, to provide a light beam having maximum intensity on the axis which passes through the center of the integral lens of the device, through the use of additional optics located in front of the LED, i.e., a second, independent lens. However, such an additional lens would cause substantial attenuation of the emitted light.

Figure 2C:
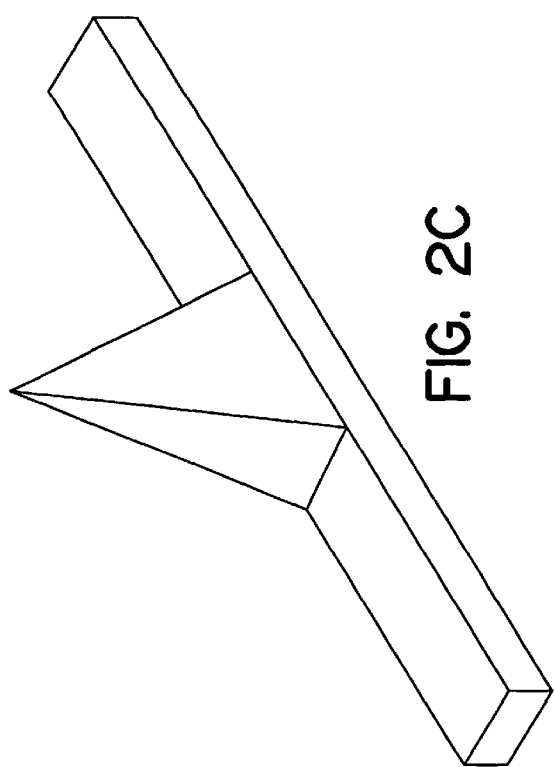
FIGS. 2A, 2B and 2C are graphical representations of a modified spacial radiation pattern of an LED achieved through employment of a reflector in accordance with the invention.
Figure 2A:
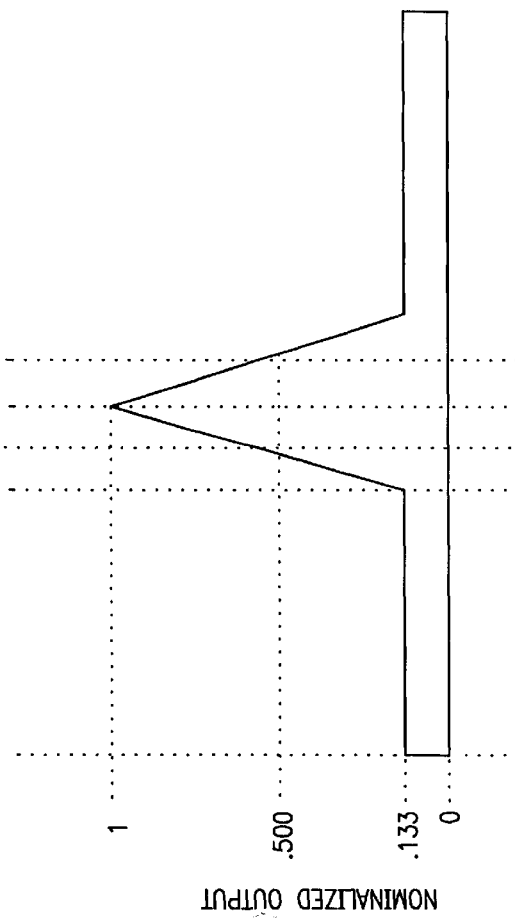
Figure 2B:
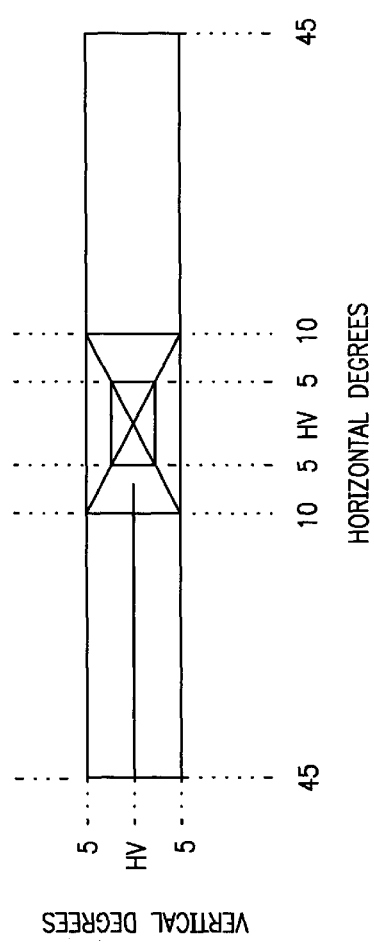

To maximize the percentage of the emitted light which will be radiated toward a remote viewer, in the manner to be described below, the present invention achieves the spacial radiation pattern represented in FIG. 2 without interposing a focusing lens between the light source and viewer. FIG. 2A is a nominalized plot, which may be compared with FIG. 1, of the radiation pattern of a single LED combined with a reflector in accordance with the invention, FIGS. 1 and 2A being plots of light intensity versus angular displacement in a horizontal plane through the axis of the integral lens of the LED. FIG. 2B is a plot of the horizontal and vertical distribution of the generated light when the LED from which the FIG. 1 data was derived is associated with a reflector in accordance with the invention. FIG. 2C is an isometric showing of relative luminous intensity versus angular displacement and clearly shows that the spacial light radiation pattern, employing the present invention, is effectively a beam which is centered about the axis of the integral lens of the LED. Those skilled in the art will recognize that FIGS. 2B and 2C are an idealized representation and, in actual practice, the reflector of FIG. 3 will a result in the bounds of the illustrated regions of different light intensity being arcuate.

Figure 3:
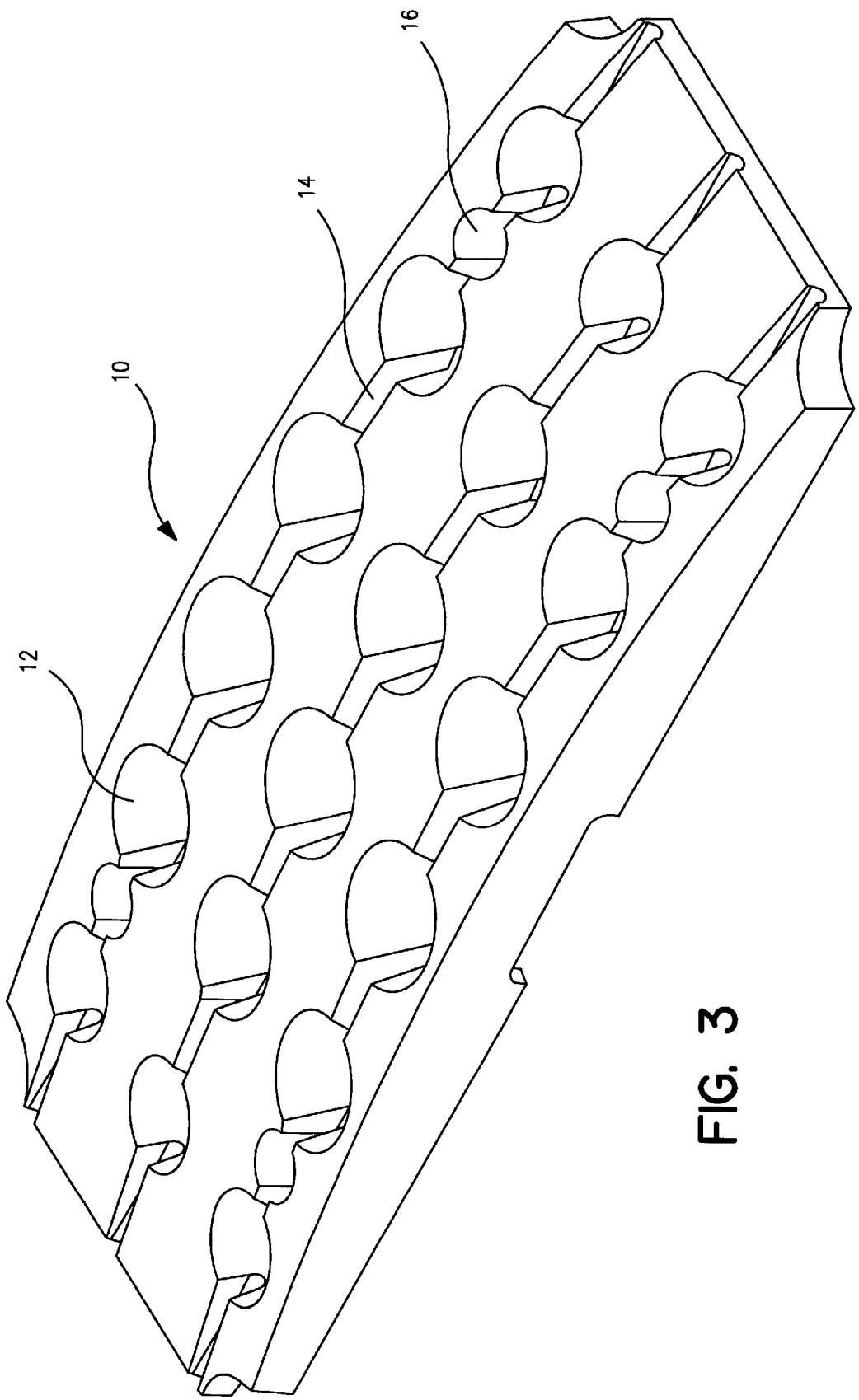
FIG. 3 is a perspective view of a reflector assembly for an array of LED's in accordance with the invention.

A one piece reflector assembly which cooperates with an array of eighteen LED's is indicated generally at 10 in FIG. 3. The assembly 10 includes a plurality of individual frustoconical reflectors 12. The reflectors 12, which may be better seen from and will be described in the discussion of FIG. 4, are arranged in rows and columns, i.e., a matrix of closely spaced reflectors 12 is presented. In the disclosed embodiment the matrix comprises three rows and six columns. The assembly 10 is preferably a molded plastic component which will be metalized to provide a reflective coating on all of the forward facing surfaces thereof. The reflective coating, which has not been separately shown, will typically be a film of aluminum applied by vacuum deposition. Assembly 10 includes, in addition to the individual reflectors 12, interconnecting grooves 14 and holes 16 which receive mounting screws.

Figure 4A:
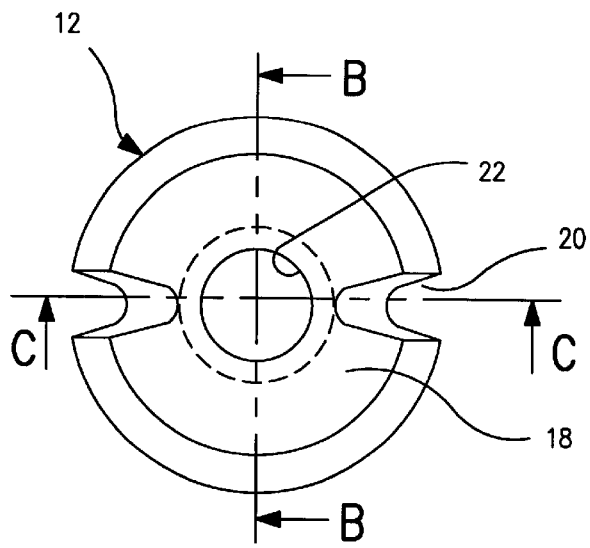
FIGS. 4A, 4B and 4C are views of a single reflector of the assembly of FIG. 3, the reflector of FIG. 4 producing the spacial radiation pattern of FIG. 2.
Figure 4B:
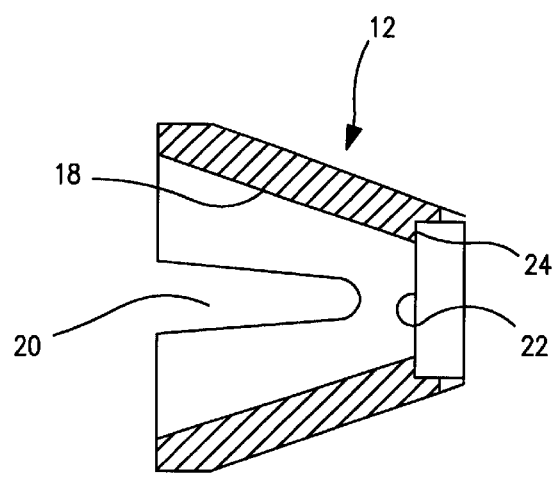
Figure 4C:
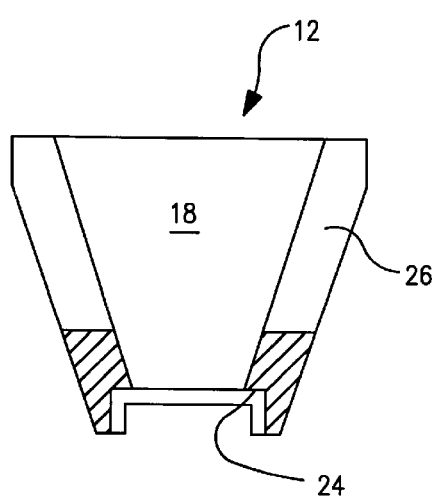

FIGS. 4A, 4B and 4C are respectively front, cross-sectional side and cross-sectional end views of a single one of the reflectors 12 of the array of FIG. 3. Thus, FIG. 4B is a view taken along line B—B of FIG. 4A while FIG. 4C is a view taken along line C—C of FIG. 4A. Each reflector 12 defines a frustoconical reflective surface 18 which is interrupted, on two opposite sides, by a slot 20 defined by the open end of a groove 14. The reflective surface 18, at its smaller diameter end, defines an opening 22 sized to receive the integral lens of an LED. On the back or rearwardly facing side of assembly 10, a shoulder 24 extends outwardly from each opening 22 in a direction transverse to the axis of the conical surface 18. Shoulder 24, in part, defines a receptacle for the body of an LED.

The grooves 14 which interconnect adjacent reflectors 12, have opposed flat walls 26 which define the slots 20. The walls 26 diverge, i.e., the grooves 14 are wider at their open top ends than at their bottoms. This angle of divergence should not exceed 10°, i.e., the angle of divergence is in the range of 0° to 10°. As may be best seen from FIG. 3, slots 20, and thus the grooves 14, have generally an obelisk cross-sectional shape. It is also worthy of note that reflector assembly 10 has a curved front surface and the individual reflectors 12 are constructed so that each LED will be spaced the same distance from this curved surface with the axes of the integral lenses of all of the LED's in the array being substantially parallel. radiation pattern represented by FIG. 1, a radiation pattern which approaches that represented in FIG. 2. The diverging grooves are essential to achieve this result. For a typical warning light application, the "hot spot", i.e., the maximum intensity light, will be projected forwardly and there will be a horizontal, i.e., up/down, spread of five (5°) degrees. The requisite radiation pattern is achieved by exercising control over the maximum slot width and the distance from the front of the reflector to the dies of the LED's.

Figure 5:
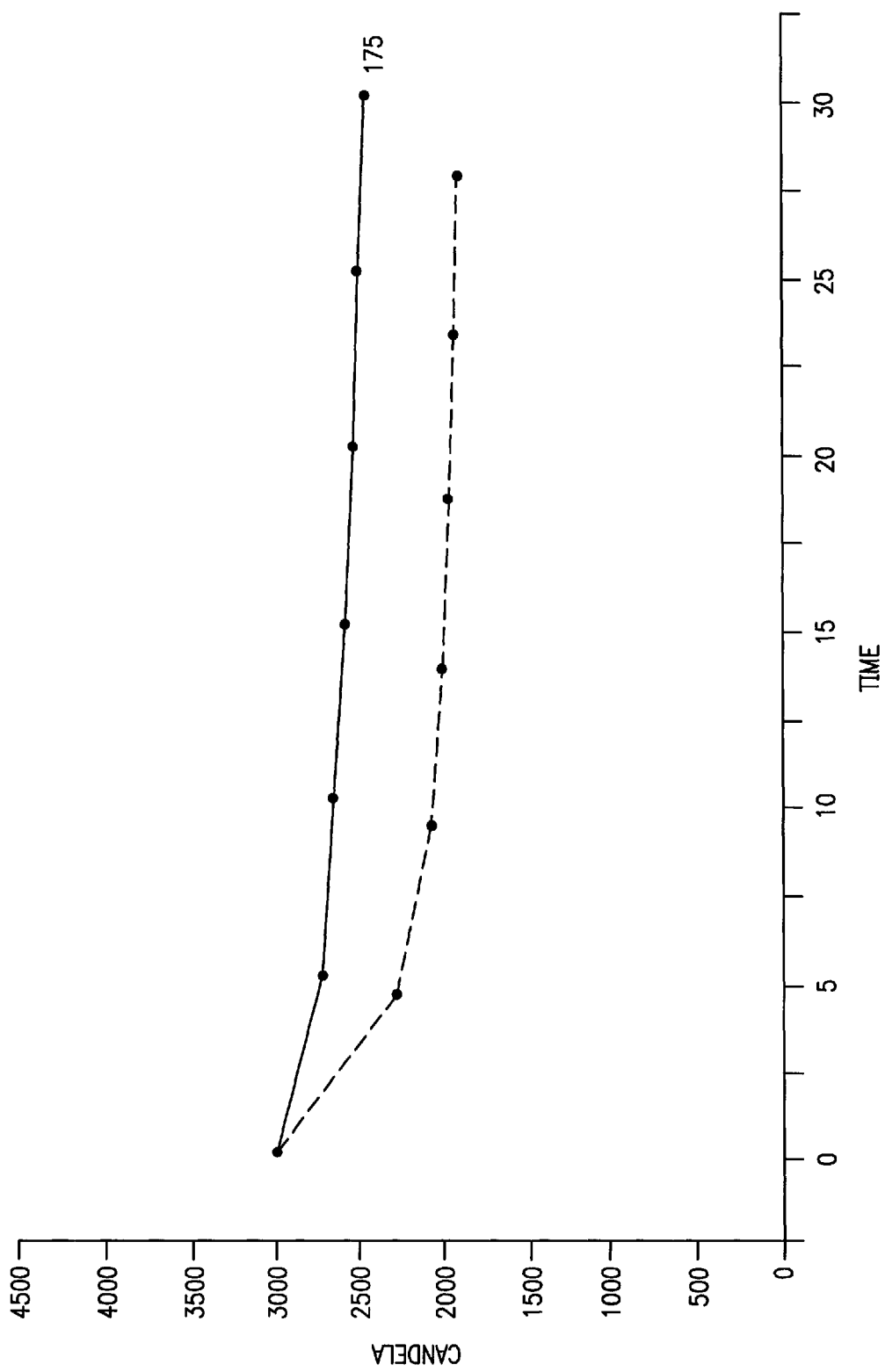
FIG. 5 is a graphical representation of the variation in light output versus time for both an unencapsulated LED and an LED installed in an array having the heat sink of the present invention.

The broken line curve of FIG. 5 is a plot of the intensity of the light output of an LED, simply mounted on a conventional circuit board, versus time. This curve clearly shows that there is a reduction in light intensity, which may be in the range of 30% to 35%, as the operating temperature of an LED increases subsequent to initial energization. This characteristic temperature increase, and the accompanying fall-off in light intensity, can not be avoided by operating the LED's in a pulsed mode. The solid line curve of FIG. 5 represents the operation of the same LED at the same level of energization but heat sinked employing the technique of the present invention. The solid line curve of FIG. 5, when compared to the broken line curve, demonstrates that an LED packaged in accordance with the invention has approximately one half the loss of intensity with time. Restated, the present invention provides, after a long period of use, a substantial increase in output intensity and a much flatter response curve through efficient heat transfer away from the light sources.

Figure 6:
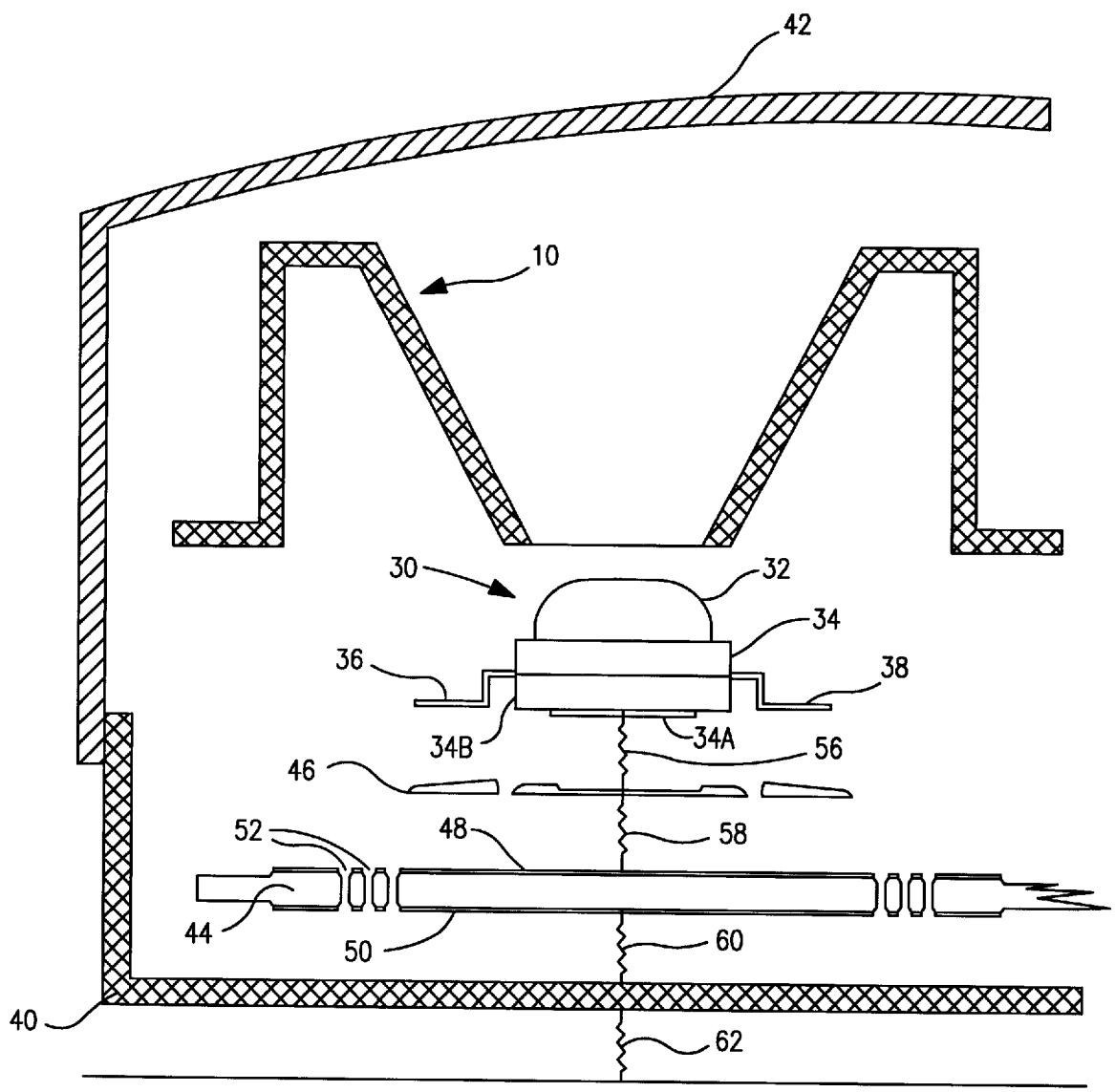
FIG. 6 is a schematic, exploded, partial, cross-sectional view of a light employing a reflector assembly and heat sink structure in accordance with the invention.
Figure 7:
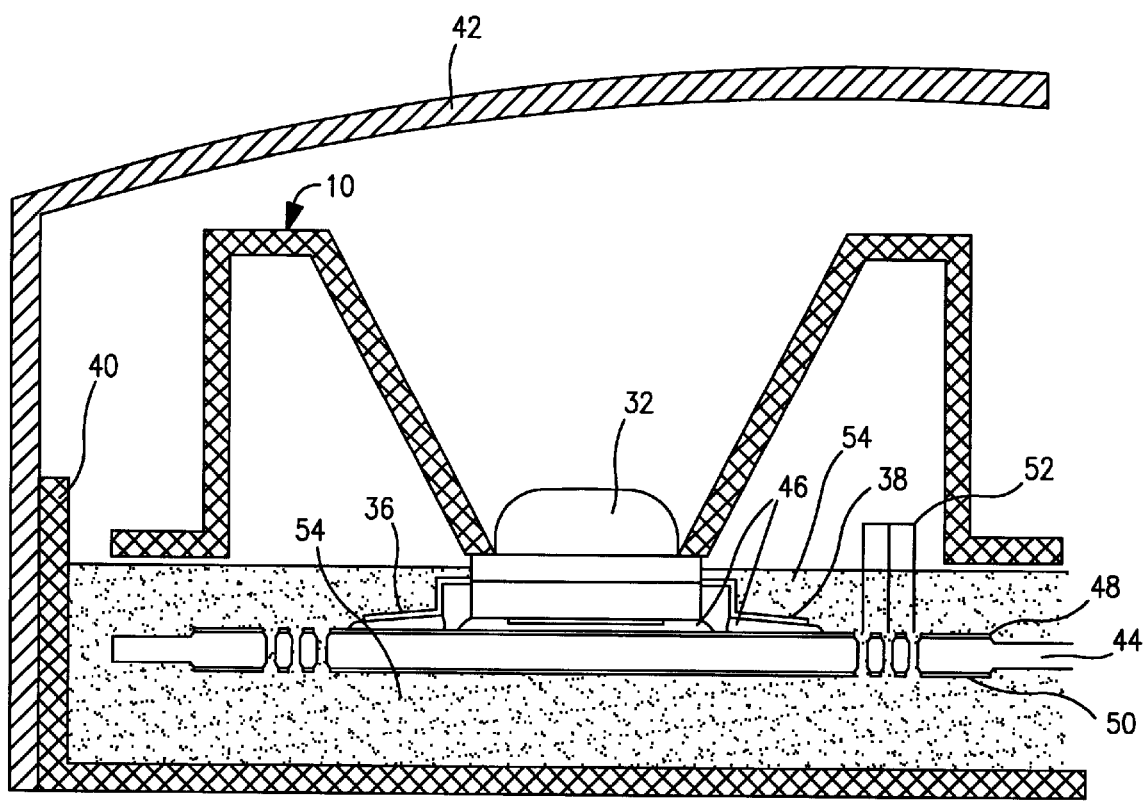
FIG. 7 is a view similar to FIG. 6 with the various components depicted in their relative operating positions.

The heat sinking technique of the present invention may be seen from joint consideration of FIGS. 6 and 7. In these figures an LED is indicated generally at 30. LED 30 has a lens 32, a body 34 and leads, indicated at 36 and 38, via which an energizing current is supplied to the device. The body 34 includes a light emitting die mounted on a high thermal conductivity slug 34A and encapsulated in a plastic lens 32, and a base 34B which receives the slug. A portion of the reflector assembly 10 of FIGS. 3 and 4, depicted schematically, may also be seen from FIGS. 6 and 7.

In the practice of the invention, the entire LED array, i.e., the reflector assembly 10 and the plural LED's 30, are supported, in the manner to be described below, on a base 40 comprised of a moldable thermally conductive plastic such as, for example, a polycarbonate with a filler such as silica or a ceramic. In one reduction to practice base 40 was Konduit OFT-212-11 available from LNP Engineered Plastics of Exton, Pa. In the embodiment being described an optically clear "lens" 42, i.e., a dust cover, isolates the reflector assembly and active devices from the ambient atmosphere and thus prevents the deposition of dirt thereon. The body 34 of LED 30 is mounted on a printed circuit board 44 by means of a thermally and electrically conductive adhesive 46. Adhesive 46 may, for example, be an epoxy such as LOCTITE 384 available from Loctite Corporation, Newington, Conn. and having a thermal conductivity of 0.757 w/mK. Printed circuit board 44 is provided, on the opposite faces thereof, with layers of copper 48 and 50. The top layer of copper 48 is etched, in the conventional manner, to define the conductors via which an energizing current may be delivered to the die of LED 30 via the leads 36, 38.

The adhesive 46 establishes a heat transfer relationship between LED body 34, particularly slug 34A, and copper layer 48. That portion of the top side copper circuit 48 to which thermal energy produced by the LED is transferred, i.e., the copper which directly underlies the LED body, is provided with a pattern of through-holes 52. The through-holes 52 are plated with copper to complete a thermal circuit between the top and bottom faces of the printed circuit board 44. The entire multilayer heat sink subassembly, i.e., the LED base, the thermally conductive adhesive, the top layer of copper 48 and the bottom layer of copper 50, is encapsulated in a material 54 having a high thermal conductivity. Encapsulation material 54 may comprise a urethane such as EPIC S7252.

In FIG. 6, the thermal resistance between body 34 of LED 30 and the thermally conductive adhesive 46 is indicated at 56 and the thermal resistance between adhesive 46 and the top layer of copper 48 is indicated at 58. The thermal resistance between the two layers of copper, via the plated through-holes 52, is negligible. The thermal resistance between the bottom layer of copper 50 and the thermally conductive base 40 is indicated at 60. Finally, the thermal resistance between base 50 and a mounting surface, which would typically be the metal side of a vehicle, is indicated at 62. The total of the thermal resistances 56–62 is much less than has been achieved in the prior art. This greatly lowered total thermal resistance permits operation at a higher energizing current level than has been possible in the prior art without a detrimental effect on the life expectancy of the LED devices.

Figure 8:
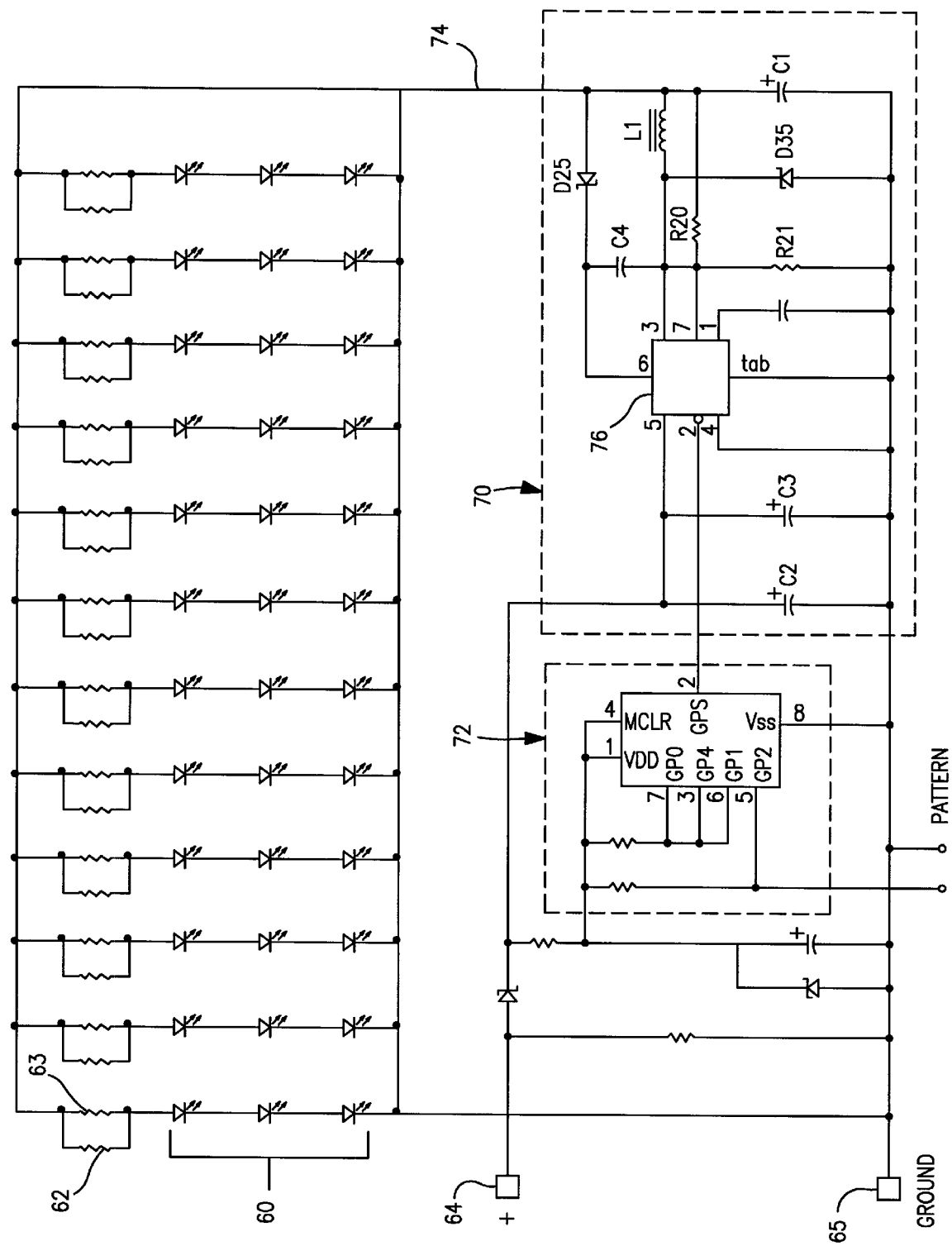
FIG. 8 is an electrical schematic diagram of a controller for an LED array in accordance with the invention.

FIG. 8 is a schematic diagram of a controller for use with a light head which utilizes an array of thirty-six (36) simultaneously energized LED's. The controller of FIG. 8 is a step-down switching regulator which automatically adjusts LED current so as to achieve a desired output light flux while ensuring a predetermined minimum service life. In the typical installation, the LED's in each column of the matrix, i.e., three (3) LED's in the case of a light head employing the reflector of FIG. 3, are connected in series and these series circuits are, in turn, connected in parallel. In FIG. 8 the series connected LED's are indicated at 60. Each group of series connected LED's 60 is also connected in series with a current limiting resistance comprising a pair of parallel connected resistors 62 and 63 as shown. A direct current voltage from a source, not shown, is connected across the input terminals to the controller, i.e., between input terminal 64 and a common or ground bus 65. The controller is protected against an accidental reverse in the polarity of the input voltage, in the conventional manner, by diodes.

The controller of FIG. 8 consists essentially of a power management section, indicated generally at 70, and a flash pattern generator, indicated generally at 72. The function of the power management circuitry is to step-down the supply voltage to a constant, preselected level which is above the break-down voltage of the series connected LED's. In a typical vehicular application, the input voltage may vary between ten (10) and fifteen (15) volts whereas the potential developed across the series circuits, i.e., between bus 74 and the ground bus 65, will be 8.6 volts. The maintenance of a constant voltage between conductors 65 and 74 will, of course, result in a constant energizing current being supplied to the LED's.

As indicated above, the power management circuit functions as a step-down switching regulator. This switching regulator comprises an active solid state controller in the form of an integrated circuit 76 which includes an active solid state controller, particularly a current mode control, a power switch, compensation control, a voltage feedback control and an oscillator. The solid state controller 76 may, for example, comprise a Linear Technologies type LT1374 wired in a classic step-down topology. The power management circuit also comprises, on the output side, an energy storage inductor L1 and an output filter capacitor Cl. Additionally, the power management circuit includes a boot strap circuit which supplies boost voltage for a power MOSFET output switch included in integrated circuit 76. Finally, the power management circuit 70 includes an input filter comprising capacitors C2 and C3.

As noted above, the light output of the LED's is a function of energizing current. The power management circuit 70 sets the energizing current to achieve the desired light output by maintaining a constant voltage across the cluster of LED's 60 independent of input voltage. The LED current is derived by subtracting the voltage drop of the LED's from the output voltage of circuit 70, divided by the effective resistance of the resistors 62 and 63. Thus, an LED current of 250 mA can be regulated with an output voltage of 8.6 volts, using a pair of ten (10) ohm limiting resistors. This constant output voltage is achieved by causing controller 76 to function as a pulse width modulator. Diode D25 and capacitor C4 are charge pump components for the gate of the internal switch of controller 76, diode D35 is the output reset diode, capacitor C6 is the output filter, and resistors R20 and R21 set the output voltage for 8.6 volts.

While a preferred embodiment has been illustrated and described above, various modifications may be made thereto without departing from the spirit and scope of the invention. Accordingly, it is to be understood that the present invention has been described by way of illustration and not limitation.

What is claimed is:

1. A unitary reflector assembly for use with a plurality of light emitting diodes, said diodes each including an integral lens, said assembly comprising:

a plurality of generally concave reflectors, said reflectors each having an frustoconical surface which defines an axis, said reflectors being arranged in at least a first linear array, the wider diameter ends of said frustoconical surfaces defining a front face of the assembly; and at least a first groove extending between adjacent reflectors of said linear array whereby said groove interrupts the frustoconical surfaces of adjacent of said reflectors, said groove having a base and being defined by walls which diverge from said base to said assembly front face.

2. The reflector assembly of claim 1, wherein the angle of divergence of said groove walls does not exceed 10°.

3. The reflector assembly of claim 1, wherein said concave reflectors define a matrix comprising plural rows and plural columns, each pair of adjacent reflectors in each row being interconnected by a said groove.

4. The reflector assembly of claim 1, wherein the regions of said reflector assembly disposed between said wider diameter ends of said frustoconical surfaces comprises said front face of said assembly, said smaller diameter ends of said frustoconical surfaces in part defining apertures which extend through a back of said assembly, said assembly back being oppositely disposed from said assembly force, said apertures being sized to receive a lens of a light emitting diode.

5. The reflector assembly of claim 3, wherein the regions of said reflector assembly disposed between said wider diameter ends of said frustoconical surfaces comprises said front face of said assembly, said smaller diameter ends of said frustoconical surfaces in part defining apertures which extend through a back of said assembly, said assembly back being oppositely disposed from said assembly force, said apertures being sized to receive a lens of a light emitting diode.

6. The reflector assembly of claim 5, wherein the angle of divergence of said groove walls does not exceed 10°.

7. The reflector assembly of claim 6, wherein the axes of said reflectors are substantially parallel.

8. The reflector assembly of claim 2, wherein the axes of said reflectors are substantially parallel.

9. A heat sink assembly for an array of light emitting diodes, said heat sink assembly comprising:

a printed circuit board, said circuit board being at least in part clad with copper on each of two opposite sides thereof, said copper cladding on at least a first side of said circuit board being etched to define passive electrical circuit components and heat absorption pads sized and shaped for affixation to individual light emitting diodes;

a plurality of copper plated holes extending through said board, said plating in said holes defining a heat transfer path between said heat absorption pads and the copper cladding on said second side of said circuit board;

a support member, said support member being comprised of a moldable thermally conductive material;

a heat conductive adhesive affixing a light emitting diode to at least some of said heat absorption pads on said printed circuit board; and a heat conductive encapsulation material surrounding said circuit board and contacting each light emitting diode adhesively affixed thereto, said encapsulation material being in contact with said support member.

10. The assembly of claim 9, wherein said support member is comprised of a polycarbonate with a high thermal conductivity filler and wherein said adhesive comprises an epoxy.

11. An integrated, multiple emitter light assembly comprising:

a reflector subassembly comprising a plurality of generally concave reflectors, said reflectors each having an frustoconical surface which defines an axis, said reflectors being arranged in at least a first linear array, the wider diameter ends of said frustoconical surfaces defining a front face of the light assembly, the smaller diameter ends of said reflectors in part defining apertures which extend through the back of said reflector subassembly, at least a first groove extending between adjacent reflectors of said linear array whereby said grove interrupts the frustoconical surfaces of adjacent of said reflectors, said groove having a base and being defined by walls which diverge from said base to said reflector subassembly front face;

a printed circuit board, said circuit board being at least in part clad with copper on each of two opposite sides thereof, said copper cladding on at least a first side of said circuit board being etched to define passive electrical circuit components and heat absorption pads sized and shaped for affixation to individual light emitting diodes, said pads being in registration with said apertures;

a plurality of copper plated holes extending through said board, said plating in said holes defining a heat transfer path between said heat absorption pads and the copper cladding on said second side of said circuit board;

a support member, said support member being comprised of a moldable thermally conductive material;

a plurality of light emitting diodes, each of said diodes having an integral lens;

a heat conductive adhesive affixing a said individual light emitting diode to at least some of said heat absorption pads on said printed circuit board:

a heat conductive encapsulation material surrounding said circuit board and contacting each light emitting diode adhesively affixed thereto, said encapsulation material being in contact with said support member; and means supporting said reflector subassembly with said light emitting diode lenses projecting through said apertures.

12. The reflector assembly of claim 11, wherein said concave reflectors define a matrix comprising plural rows and plural columns, each pair of adjacent reflectors in each row being interconnected by a said groove.

13. The reflector assembly of claim 12, wherein the angle of divergency of said groove walls does not exceed 10°.

14. The reflector assembly of claim 13, wherein the axes of said reflectors are substantially parallel.

* * * * *